United States Patent [19]

Sim

[11] Patent Number: 5,753,532
[45] Date of Patent: May 19, 1998

[54] METHOD OF MANUFACTURING SEMICONDUCTOR CHIP PACKAGE

[75] Inventor: Sung Min Sim, Kyungki-do, Rep. of Korea

[73] Assignee: Samsung Electronics Co., Ltd., Suwon, Rep. of Korea

[21] Appl. No.: 704,996

[22] Filed: Aug. 29, 1996

[30] Foreign Application Priority Data

Aug. 30, 1995 [KR] Rep. of Korea ............... 95-27653

[51] Int. Cl.⁶ ................................................ H01L 21/60
[52] U.S. Cl. .................... 437/217; 437/209; 437/214; 437/215; 437/219
[58] Field of Search .............................. 437/209, 211, 437/214, 217, 218, 219, 220

[56] References Cited

U.S. PATENT DOCUMENTS

| | | | |
|---|---|---|---|
| 5,258,331 | 11/1993 | Masumoto et al. | 437/220 |
| 5,336,564 | 8/1994 | Moldavsky | 437/220 |
| 5,352,633 | 10/1994 | Abbott | 437/217 |
| 5,369,059 | 11/1994 | Eberlein | 437/217 |
| 5,378,656 | 1/1995 | Kajihara et al. | 437/220 |
| 5,422,314 | 6/1995 | Sekiba | 437/220 |

*Primary Examiner*—Kevin Picardat
*Attorney, Agent, or Firm*—Jones & Volentine, L.L.P.

[57] ABSTRACT

A method for manufacturing semiconductor chip package comprising steps of: (a) preparing a lead frame which comprises a pair of opposing side rails which have a plurality of through holes on their upper surface; a die pad onto which a chip will be mounted; a pair of rows of leads, each row being disposed at both sides of the die pad at a distance; and tiebars for mechanically and integrally connecting said die pad to said side rails; (b) filling a resin compound between leads and curing the resin compound to make dambars; (c) attaching said chip to an upper surface of said die pad, and electrically connecting said chip to leads; (d) encapsulating said chip, said die pad, said dambars, a part of said leads and a part of said tiebars to give a package body which is still attached to said lead frame; and (e) cutting said tiebars from lead frame to separate an individual package; and (f) forming leads extending from the package to have an appropriate bend shape is provided.

11 Claims, 24 Drawing Sheets

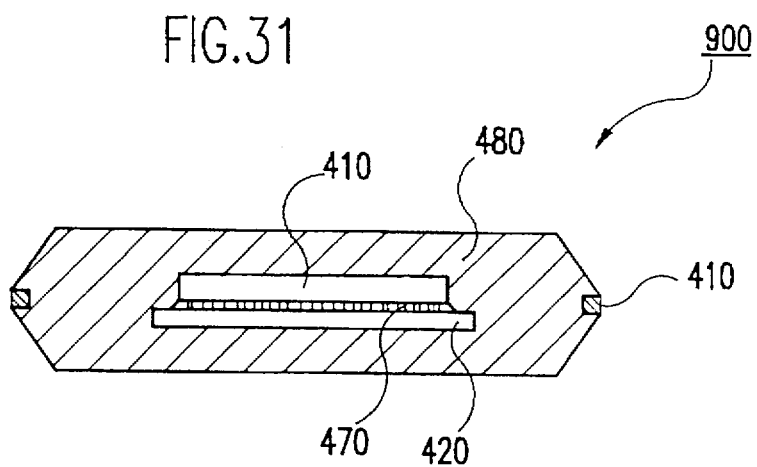

METHOD OF MANUFACTURING SEMICONDUCTOR CHIP PACKAGE

BACKGROUND OF THE INVENTION

1. Field of the Invention

The present invention relates generally to a process for manufacturing a semiconductor chip package, and in particular to a process for manufacturing a semiconductor chip package using a lead frame having resin dambars.

2. Description of the Related Arts

FIG. 1 is a perspective view of a conventional lead frame having dambars; and FIG. 2 shows the bonding of a chip to the lead frame of FIG. 1. With reference to FIGS. 1 and 2, the conventional lead frame (100) comprises a pair of side rails (60) being opposed to each other; a die pad (20) onto which a chip (not shown) will be mounted; tie-bars (50) for mechanically and integrally connecting said die pad to said side rails; a pair of rows of leads (30), each row being disposed by sides of the die pad (20) at a distance; and dambars (40) which span the rows of the leads in vertical direction and are integrally connected to the side rails.

In more detail, a pair of opposing side rails (60) has a plurality of through holes (62) regularly formed at the same points of each side rail. Side rails (60) are in mechanical contact with rails (not shown) having a plurality of projections when lead frame (100) moves within a semiconductor chip packaging line. That is to say, the projections of the rail fit into the respective corresponding through holes (62) of side rail (60). When, the rail moves, lead frame (100) will be transferred accordingly.

Die pad (20) is formed between side rails (60) and mechanically and integrally connected to side rails (60) through tiebars (50).

A pair of rows of leads (30) is formed in parallel, each row being disposed by each side of die pad (20). Leads (30) will be electrically connected to a chip mounted on die pad (20). Dambars (40), which have the same thickness as that of leads, are formed spaning the rows of leads (30) in vertical direction. Dambars (40) have a role of barriers that prevent a flashing of the molding resin compound during a molding process. Leads (30) are Pd- or Ni-plated to provide a protection from the exterior environments.

FIG. 3 shows an electrical connection of the chip to the lead frame; and FIG. 4 shows the lead frame with a molded chip. With reference to FIGS. 3 and 4, the chip (10) is banded onto die pad (20) using an Ag-epoxy adhesive 70 (see FIG. 2). Chip (10) is electrically connected to leads (30) through bonding wires (80) which connect bonding pads (12) on an un upper surface of chip (10) to respective corresponding leads (30).

The chip (10), die pad (20), bonding wires (80), a part of tie bars (50) and a part of leads (30), said parts being adjacent to the die pad (20), are encapsulated with a molding compound to give a package body (90). Leads (30) are consisted of inner leads that are inside the package body (90) and outer leads (34) extending from the package body (90).

During the molding process, flashing (92) is formed at surfaces of package body (90) at the spaces between individual neighboring outer leads (34).

FIG. 5 shows the lead frame of FIG. 4 after cutting dambars; and FIG. 6 shows the lead frame of FIG. 4 after the flashing is removed ("Deflasing process"). With reference to FIGS. 5 and 6, the lead frame carrying molded package bodies is treated with a dambar stripper to remove dambars (40) formed between individual leads (30) and between a side rail and its neighboring lead so that leads (30) can be detached from side rails (60). There are formed burrs at surface areas (34a) of leads (30) which were in contact with dambars (40) after removing dambars (40). At burrs, Pd or Ni plating is peeled off and lead is exposed to external environments, causing a corrosion and deterioration of reliability of a final semiconductor chip package. To avoid this problem, a plating process should be carried out to plate the leads ("Replating process"), resulting in an increase of production cost and a reduction of productivity.

The package body (90) does not have a smooth or even surface, since molding process leaves flashing (92) at surfaces of package body (90) at the spaces between neighboring outer leads. Therefore, flashing (92) should be removed from the package body (90) by, for example, chemical treatments to pass a visual test.

FIG. 7 shows the lead frame of FIG. 4 after replating process; FIG. 8 is a longitudinal sectional view taken along the line 8—8 of FIG. 7; FIG. 9 shows a separation of the individual chip package from the lead frame of FIG. 7; and FIG. 10 shows the individual chip package with formed outer leads. With reference to FIGS. 7 through 10, after removing flashing (92), the package body is subjected to plating process to cover outer leads (34) with second palladium or nickel plating(34c)("Replating process").

The outer leads (34), in more detail, are made of copper (34a) and have a first Pd - or Ni-plating (34b) over their surfaces. However, during the dambar-removing process, first plating (34b) is stripped at areas (burrs") to which dambars are attached, the second plating (34c) should be formed over the areas ("Replating process"). The replating process may be carried out by, but not limited thereto, an electroplating process in which the lead frame to be plated is immersed into a plating bath containing palladium or nickel and electricity is applied thereto. Numerical number 34 ' in FIGS. 7 through 11 indicate the replated leads.

The second plating (34c) also has a role of facilitating electrical connections of the package to an exterior electronic apparatus such a printed circuit board (not shown).

Then, tiebars (50) are removed with a cutting machine (not shown) to give an individual package (200). The individual package (200) is then subjected to a forming process in which outer leads (34) are bent to give an appropriate shape to be mounted onto external electronic parts such as printed circuit board. In this embodiment, the lead frames are formed to have a gull-wing shape.

FIG. 11 is a longitudinal sectional view taken along the line 11—11 of FIG. 10. With reference to FIG. 11, the conventional semiconductor chip package (200) has a structure in which a chip (10) is attached onto an upper surface of die pad (20) with an Ag-epoxy adhesive (70). The chip (10) is electrically connected to inner leads (32) through bonding wires (80) which are connected to individual bonding pads (12) on chip (10) and respective corresponding inner leads (32) at both ends.

The chip (10), die pad (20), bonding wires (80), a part of tie bars (50) and a part of leads (30), said parts being adjacent to the die pad (20), are encapsulated with a molding compound to give a package body (200). Leads (30) are consisted of inner leads (32) which they embed within the package body (200) and outer leads (34) extending from the package body (200).

The above-described method of manufacturing a semiconductor package chip has following disadvantages:

(1) The flashing should be removed by chemical or other processes. Semiconductor manufacture has developed to provide more compact, lighter, and thinner packages. The recent trend of environmental protection becomes also an important factor of all kinds of industries, including semiconductor manufacture industry. A chemical removal of flashing may raise an environmental pollution problem.

Further, any method of removing flashing will leave pollutional materials.

(2) The outer leads should be replated with palladium or nickel, since the outer leads are peeled off at the parts bonded to dambars during dambar-removing process as described in the above.

A conventional dambarless lead frame is proposed to overcome the problems associated with the above-described conventional dambarless lead frame. FIG. 12 is a perspective view showing the other conventional lead frame without dambars. With reference to FIG. 12, lead frame (300) comprises a pair of side rails (260) opposed to each other; a die pad (220) onto which a chip (not shown) will be mounted; a pair of rows of leads (230), said rows of leads being disposed at both sides of die pad (220) at a distance; and tiebars (250) for mechanically and integrally connecting said die pad to said side rails.

In more detail, a pair of opposing side rails (260) has a plurality of through holes (262) formed at regular intervals on their upper surface. Side rails (260) are in mechanical contact with rails (not shown) having a plurality of projections when lead frame (300) moves within a semiconductor chip packaging line. That is to say, the projections of the rail fit into the respective corresponding through holes (262) of side rails (260). When the rail moves, lead frame (300) is transferred accordingly.

Die pad (220) is formed between opposing side rails (260) and mechanically and integrally connected to side rails (260) through tiebars (250).

A pair of rows of leads (230) is formed in parallel and the rows are disposed at both sides of die pad (220) at a distance. Leads (230) will be electrically connected to a chip mounted on die pad (220). Leads (230) are mechanically and integrally connected to side rails (260) through tiebars (250). For the leads (230), one end faces he side of die pad (220), while the other end is commonly connected to tie bar (250). Leads (30) are Pd- or Ni-plated to provide a protection from the exterior environments.

FIG. 13 shows a bonding of a chip to die pad; FIG. 14 shows an electrical connection of the chip to the lead frame; and FIG. 15 shows the lead frame with a molded chip. With reference to FIGS. 13 through 15, the chip (210) is attached to die pad (220) using an Ag-epoxy adhesive (270). Chip (210) is electrically connected to leads (230) through bonding wires (280) which connect bonding pads (212) on chip (210) to respective corresponding leads (230).

The chip (210), die pad (220), bonding wires (280), a part of tie bars (250) and a part of leads (230), said parts being adjacent to die pad (220), are encapsulated with a molding compound to give a package body (290). Leads (230) are consisted of inner leads which are inside the package body (290) and outer leads (234) extending from the package body (290).

During the molding process, flashing (292) is formed at surfaces of package body (290) at the spaces between individual neighboring outer leads (234).

FIG. 16 shows a lead frame of FIG. 15 after deflashing process; FIG. 17 shows a separation of the individual chip package from the lead frame; and FIG. 18 shows an individual chip package with formed outer leads. With reference to FIGS. 16 through 18, the package body (290) does not have a smooth or even surface, since molding process leaves a large amount of flash (292) outside the package body (290) at the spaces between neighboring outer leads(234). Therefore, flash (292) should be removed from the package body (290) by, for example, chemical treatments to pass a visual test.

Then, tiebars (250) are removed with a cutting machine (not shown) to give an individual package (400). The individual package (400) is then subjected to a forming process in which outer leads (234) are bent to give an appropriate shape to be mounted onto external electronic parts such as printed circuit board. In this embodiment, the lead frames are formed to have a gull-wing shape.

FIG. 19 is a longitudinal sectional view taken along the line 19—19 of FIG. 18. With reference to FIG. 19, the conventional semiconductor chip package (400) has a structure in which a chip (210) is attached onto an upper surface of die pad (220) with an Ag-epoxy adhesive (270). The chip (210) is electrically connected to inner leads (232) through bonding wires (280) which are connected to individual bonding pads (212) on chip (210) and respective corresponding inner leads (232) at both ends.

The chip 210), die pad (220), bonding wires (280), a part of tie bars (250) and inner leads (232) are encapsulated with a molding compound to give a package body (290). Leads (230) are consisted of inner leads (232) which are embedded within the package body (290) and outer leads (234) extending from the package body (290).

The above-described method of manufacturing the package employs lead frame without dambars ("dambarless lead frame") to avoid the disadvantages of the former method. Nevertheless, this method also has a problem associated with the formation of a large amount of flashing during the molding process. That is to say, the flashing should be removed by chemical or other processes, resulting in a serious environmental pollution problem.

The formation of a large quantity of flashing can be avoided to some extent by employing a sophisticated designed molding machine. However, this will cause an increase of production cost.

Accordingly, there has been a need to provide a new simple and cost-effective method for manufacturing a semiconductor chip package, which is free from environmental pollution.

SUMMARY OF THE INVENTION

Thus, an object of the invention is to provide a method for manufacturing a semiconductor chip package comprising steps of:

(a) preparing a lead frame, which comprises a pair of opposing side rails which have a plurality of through holes on their upper surface; a die pad onto which a chip will be mounted; a pair of rows of leads, each row being disposed at both sides of the die pad at a distance; and tie bars for mechanically and integrally connecting said die pad to said side rails;

(b) filling a resin compound between leads and curing the resin compound to make dambars;

(c) attaching said chip to an upper surface of said die pad, and electrically connecting said chip to said leads;

(d) encapsulating said chip, said die pad, said dambars, a part of said leads and a part of said tiebars to give a package body which is still attached to said lead frame;

(e) cutting said tiebars from lead frame to separate an individual package; and (f) forming outer leads extending from the package to have an appropriate bend shape.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 21A shows an enlarged view of portion C of FIG. 21;

FIG. 21B shows an enlarged view of portion D of FIG. 21;

FIG. 21C shows an enlarged view of portion E of FIG. 21; and

FIG. 31 is a longitudinal sectional view taken along the line 31—31 of FIG. 29.

DETAILED DESCRIPTION OF THE INVENTION

The present invention will now be described in more detail with reference to accompanying drawings.

Figure 20:
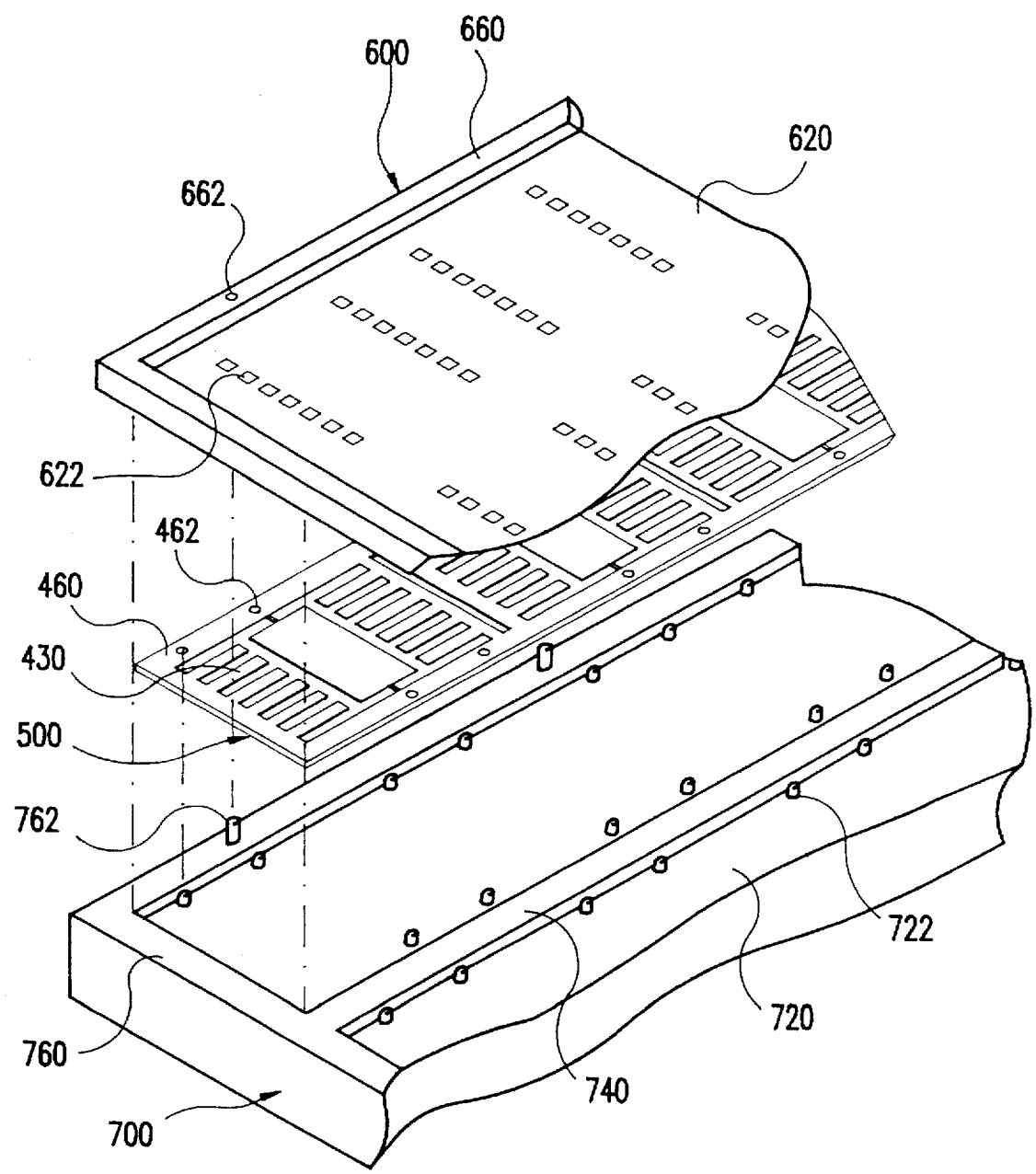
FIG. 20 shows a stacking of a lead frame and stencil onto a fixing frame.
Figure 21:
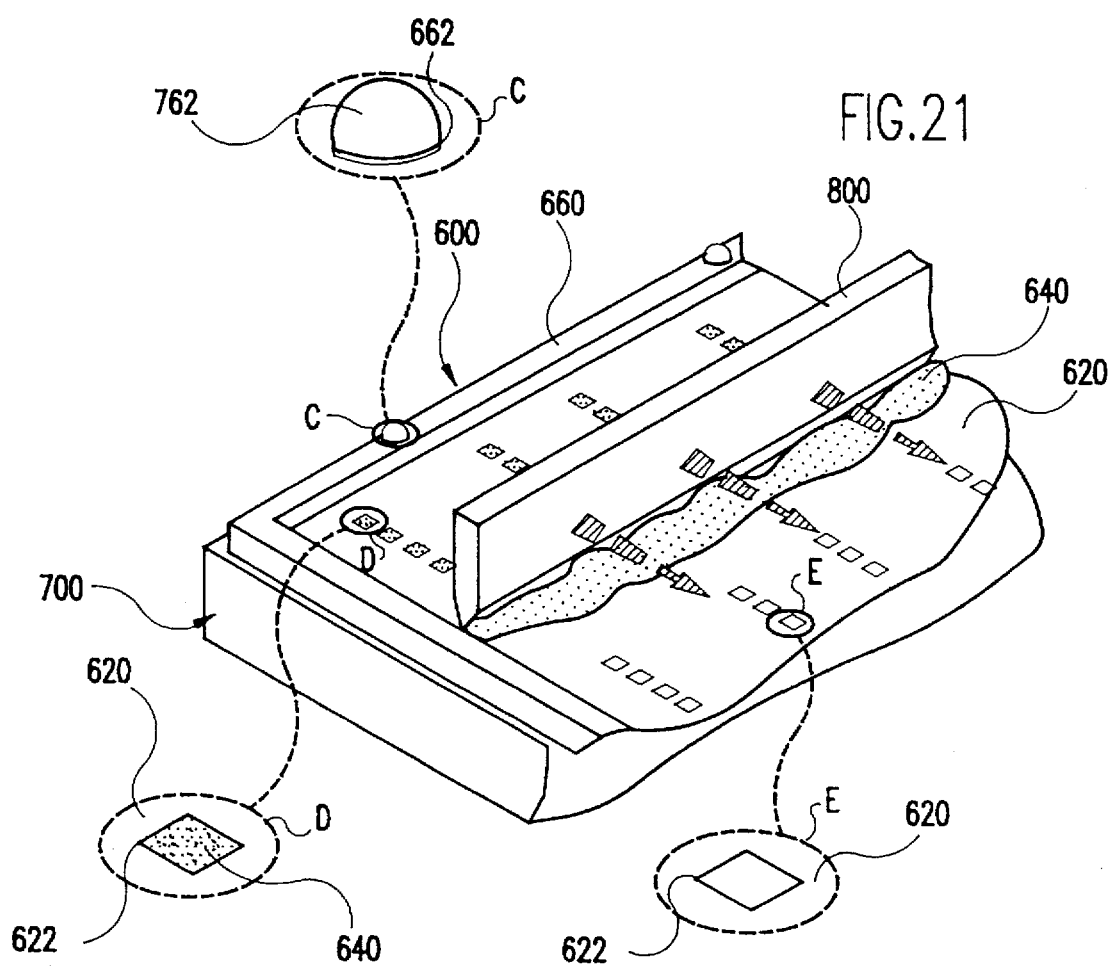
FIG. 21 shows a formation of liquid dambars for a dambarless lead frame.

FIG. 20 shows a stacking of a lead frame and a stencil onto a fixing frame employed for the method of the present invention; and FIG. 21 shows a formation of liquid dambars between leads. With reference to FIGS. 20 and 21, fixing frame (700) employed for manufacturing lead frame according to the present invention comprises a plurality of receiving parts (720) for receiving lead frames (500), partition walls (740) for separating the receiving parts (720) from each other, and walls (760) formed at four sides of fixing frame (700).

In more detail, receiving parts (720) are for receiving lead frames (500), one receiving part for one lead frame, and have projections (722) at points which will be aligned with through holes (462) of side rails (460) of lead frame (500). Partition walls (740) separate a receiving part (720) from neighboring receiving parts (720). Walls (760) have guide pins (762) at their upper surfaces and serve as a framework for fixing frame (700). The receiving parts (720), partition walls, (740) and walls (760) are in integration together. Inner surfaces of receiving parts (720) are coated with a material which does not bond to a liquid resin compound. Liquid resin compound shows stronger adhesion to lead frames (500) than to fixing frame (700).

Stencil (600) comprises walls (660) provided with a plurality of guide holes (662) corresponding to respective guide pins (762) formed at walls (760) of fixing frame (700), and printing parts (620) having a plurality of perforations (622) at points where resin dambars will be formed between leads (430) of lead frame (500) in receiving parts (720). The position where dambars are firmed will be described below. Walls (660) have greater height than printing parts (620). For receiving parts (700), partition walls (740) and projections (722) of receiving parts (720) have the same height as that (thickness) of leads of lead frames (500) which will be placed in receiving parts (720). The height of projections (722) of fixing frame (700) is smaller than the height (thickness) of leads of lead frame (500) so that the upper surface of lead frame (500) can be totally in contact with the lower surface of stencil (600), thereby ensuring the formation of stable and solid resin dambars (440).

The stacking of fixing frame (700), lead frames (500) and stencil (600) in turn from the bottom will be described hereinafter. First, fixing frame (700) is prepared. Lead frames (500) are placed in respective corresponding receiving parts (720) by aligning their through holes (462) with respective corresponding projections (722) of receiving parts (720).

Then, stencil (600) is placed onto lead frames (500) fitted in receiving parts (720) and aligned its guide holes (662) with respective corresponding guide pins (762) of fixing frame (700). By doing this, perforations (622) of stencil (600) will automatically be aligned with points of lead frames where resin dambars will be formed.

FIG. 21 shows the formation of liquid resin dambars for a lead frame. With reference to FIG. 21, a liquid resin compound (640) is placed onto printing part (620) so as to cover its upper surface. The liquid resin compound (640) may include, but not limited thereto, polyimide compounds. Then, printing part (620) is pressed by using a pressing means such as a roller (800) or plate so that resin compound (640) can be penetrated through perforations (622) into spaces between individual leads where dambars (440) will be formed. Walls (660) of stencil (600) prevents guide holes (662) from being filled with resin compound (640). Resin compound (640) fills the spaces between leads of a lead frame which is placed in receiving part (720), said spaces corresponding to perforations (622) of stencil (600).

Figures 22, 22A:
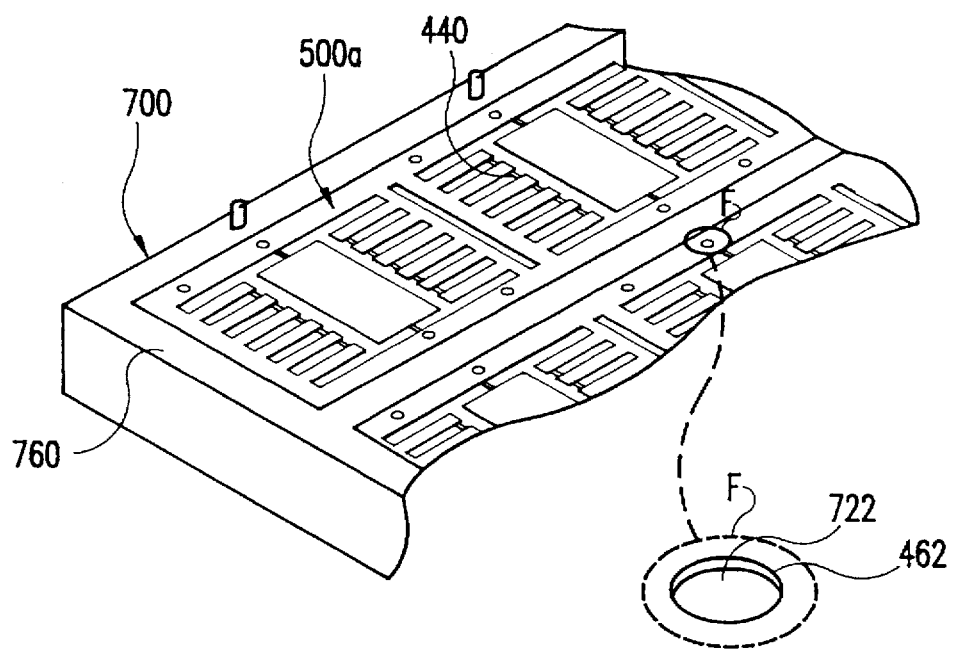
FIG. 22 shows a formation of liquid dambars for some dambarless lead frame.
FIG. 22A shows an enlarged view of portion F of FIG. 22.
Figure 23:
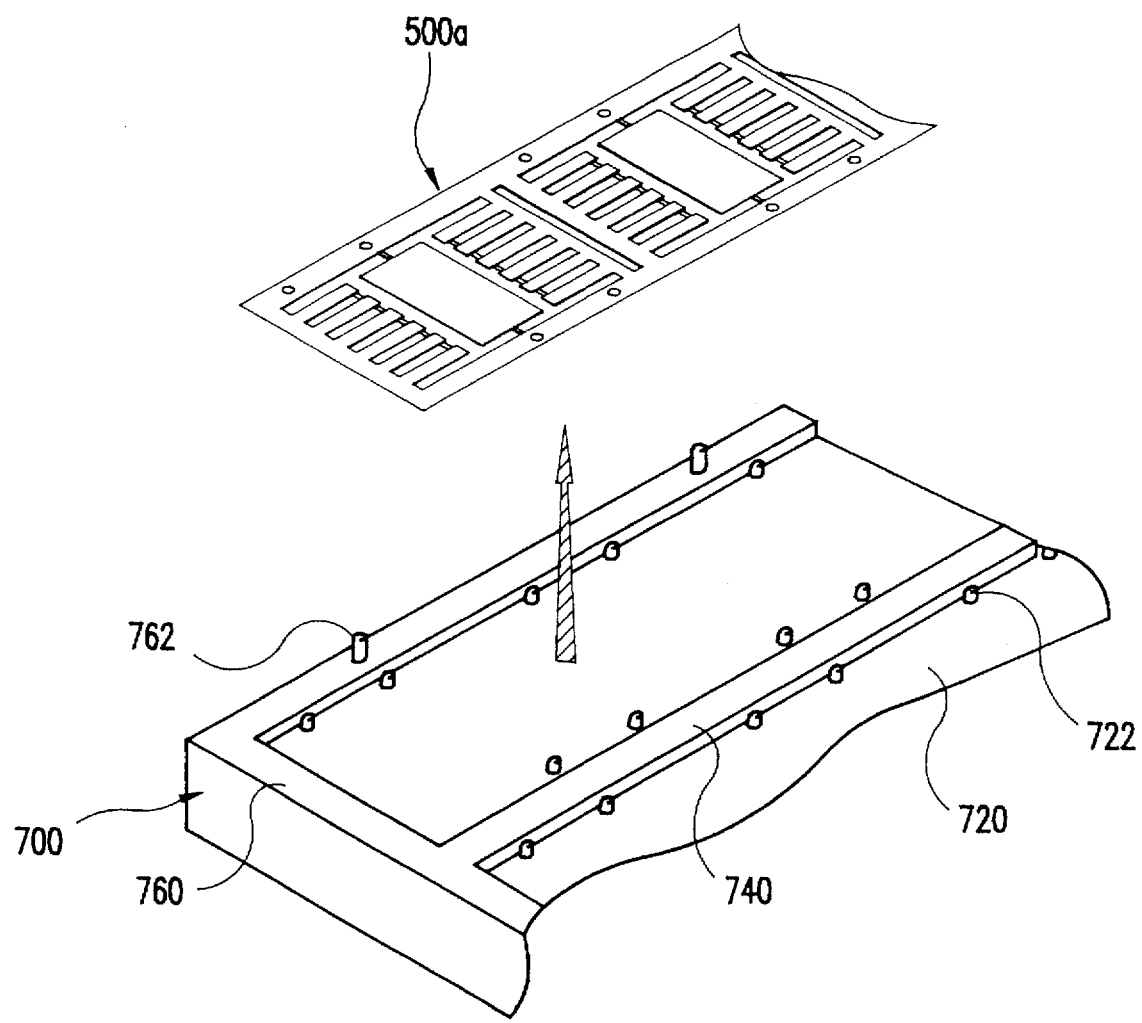
FIG. 23 shows a separation of lead frame with liquid dambars from fixing frame.
Figure 24:
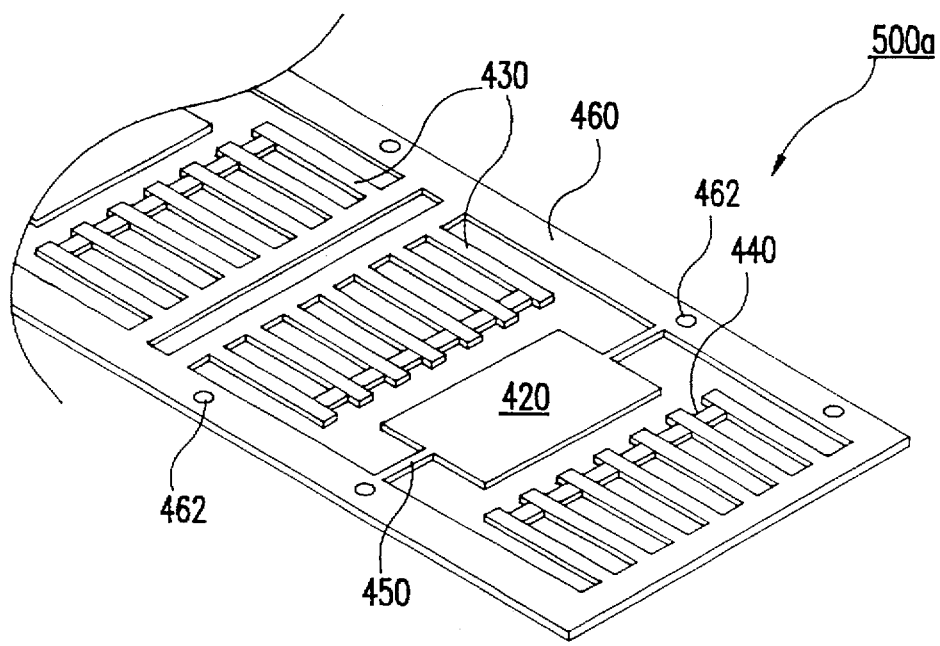
FIG. 24 shows a formation of resin dambars for a lead frame.

FIG. 22 shows a lead frame having liquid dambars, said lead frame being placed in a fixing frame for forming the liquid dambars; FIG. 23 shows a separation of the lead frame from the fixing frame; and FIG. 24 shows the lead frame -with liquid dambars. With reference to FIGS. 22 through 24, after resin dambars (440) are formed in spaces between leads of lead frame (500a), stencil (600) is removed from fixing frame (700). Then, lead frame (500a) and fixing frame (700) together are transferred to a thermosetting apparatus (not shown) where resin dambars (440) are cured. After the curing, individual lead frame (500a) is removed from fixing frame (700).

Lead frame (500a) with resin dambars (440) has a structure that a pair of opposing side rails (460) is provided; a die pad (420) onto which a chip will be mounted is disposed between side rails (460); a pair of rows of leads (430) is provided, each row being disposed at both sides of die pad (220) at a distance; tie bars connect mechanically and integrally die pad (420) to side rails (460); and dambars (440) are provided at spaces between individual leads (430).

Herein, a pair of side rails (460) is disposed so that one is opposed to the other, and have plural through holes (462) formed at regular intervals. Side rails (460) are in mechanical contact with rails (not shown) having a plurality of projections when transferring lead frame (500) within a semiconductor chip packaging line. That is to say, the projections of rail fit into the respective corresponding through holes (462) of side rail (460). Thus, when the rail moves, lead frame (500) is transferred accordingly.

Figure 1:
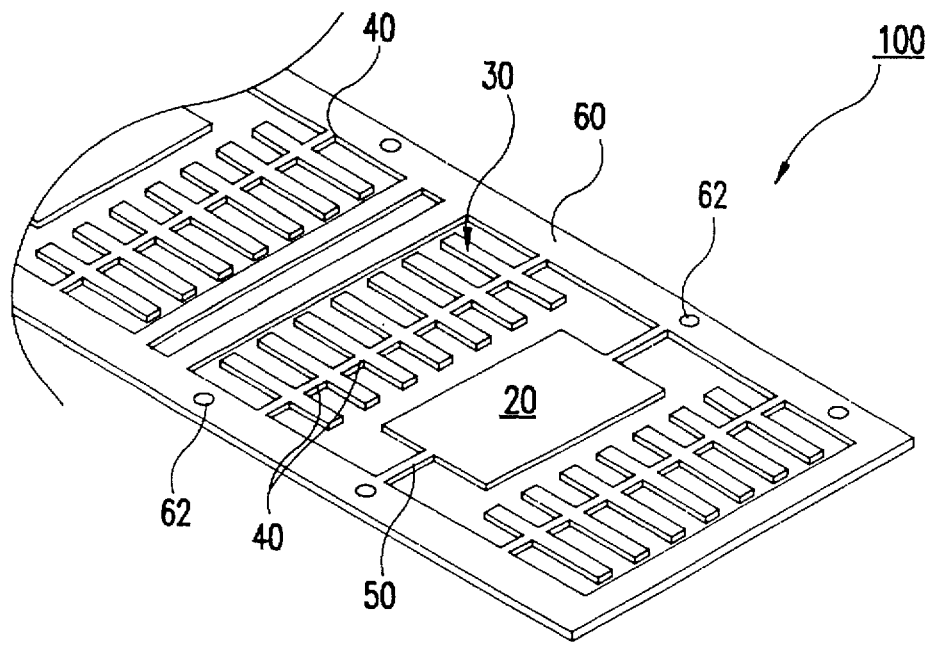
FIG. 1 is a perspective view of a lead frame having conventional dam-bars.
Figure 2:
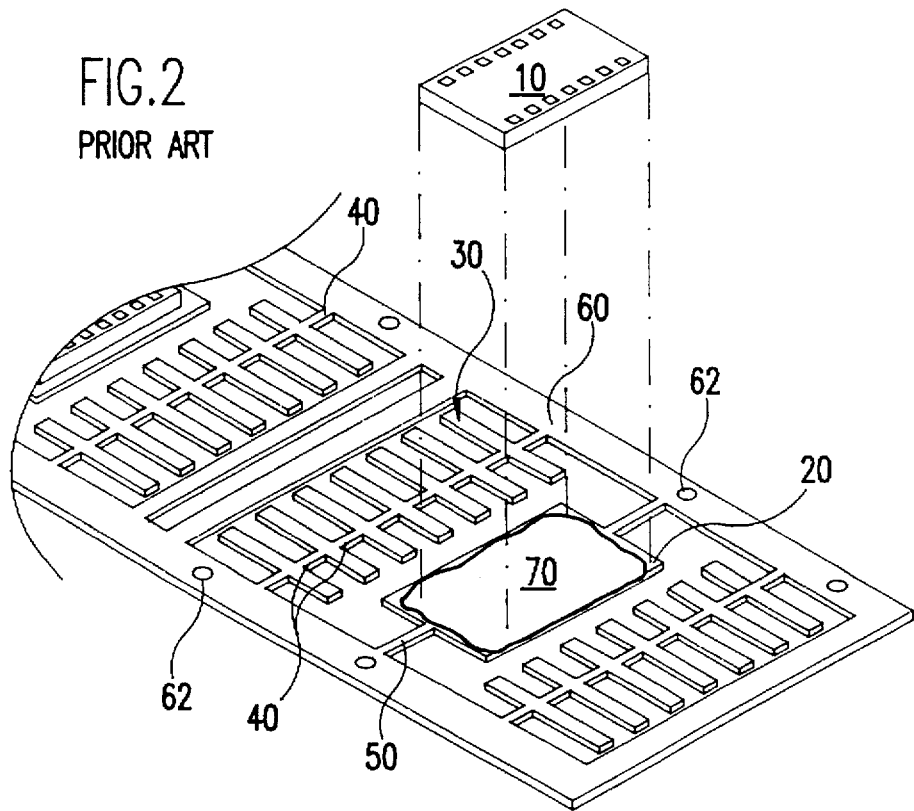
FIG. 2 shows a bonding of a chip to a lead frame.
Figure 3:
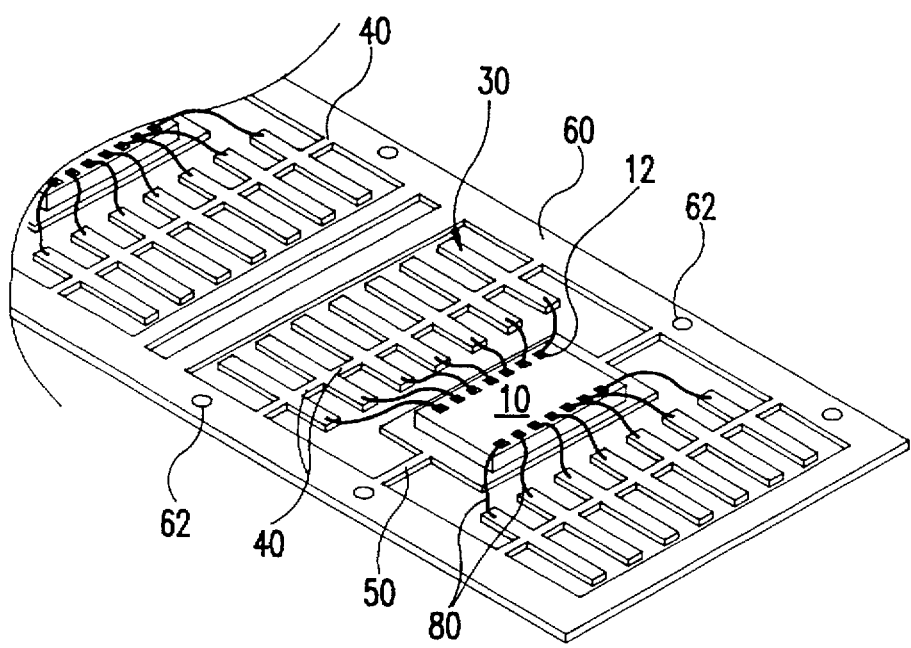
FIG. 3 shows an electrical connection of the chip to the lead frame.
Figure 4:
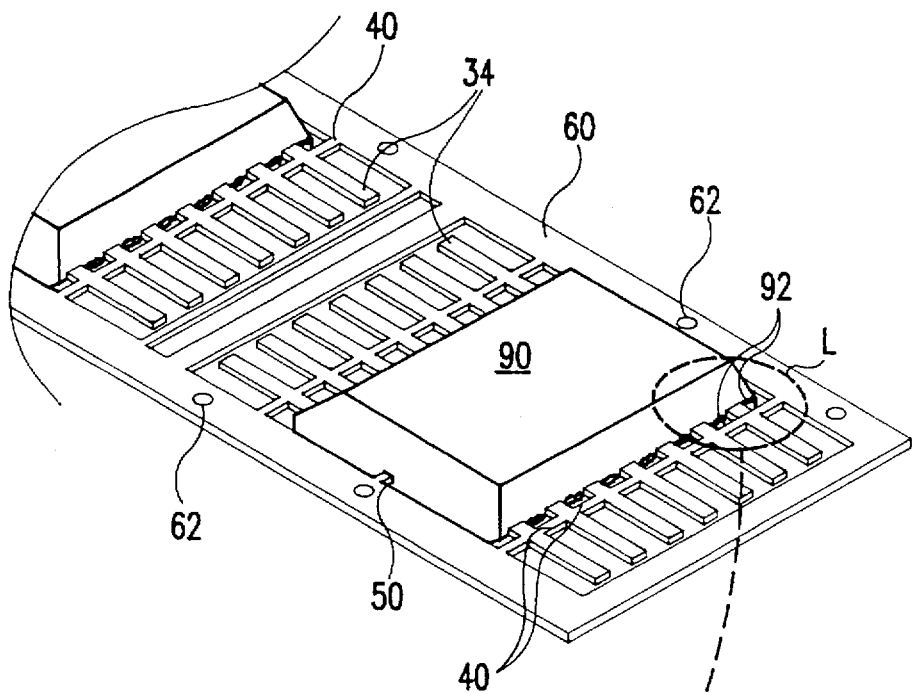
FIG. 4 shows the lead frame with a molded chip.
Figure 4A:
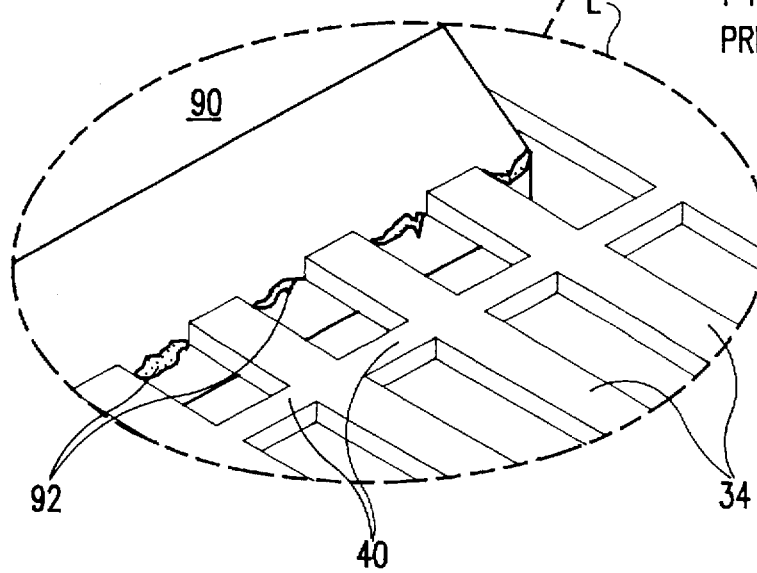
FIG. 4A shows an enlarged view of portion L of FIG. 4.
Figure 5:
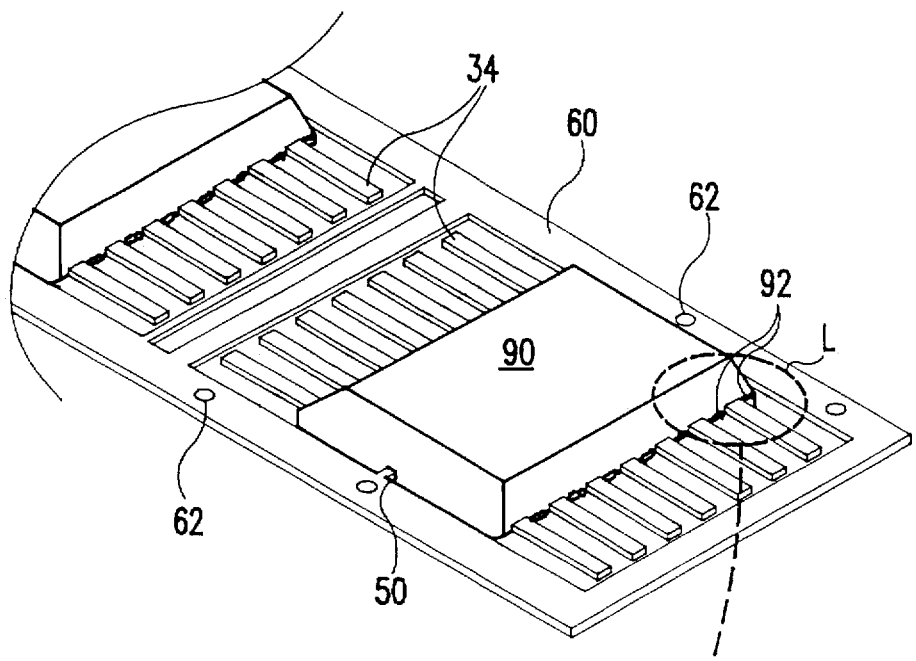
FIG. 5 shows the lead frame of FIG. 4 after cutting dam-bars.
Figure 5A:
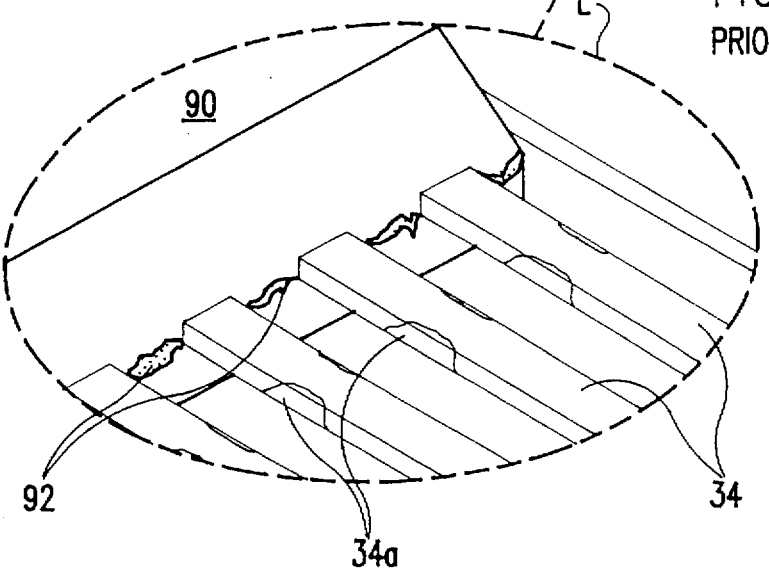
FIG. 5A shows an enlarged view of portion L of FIG. 5.
Figure 6:
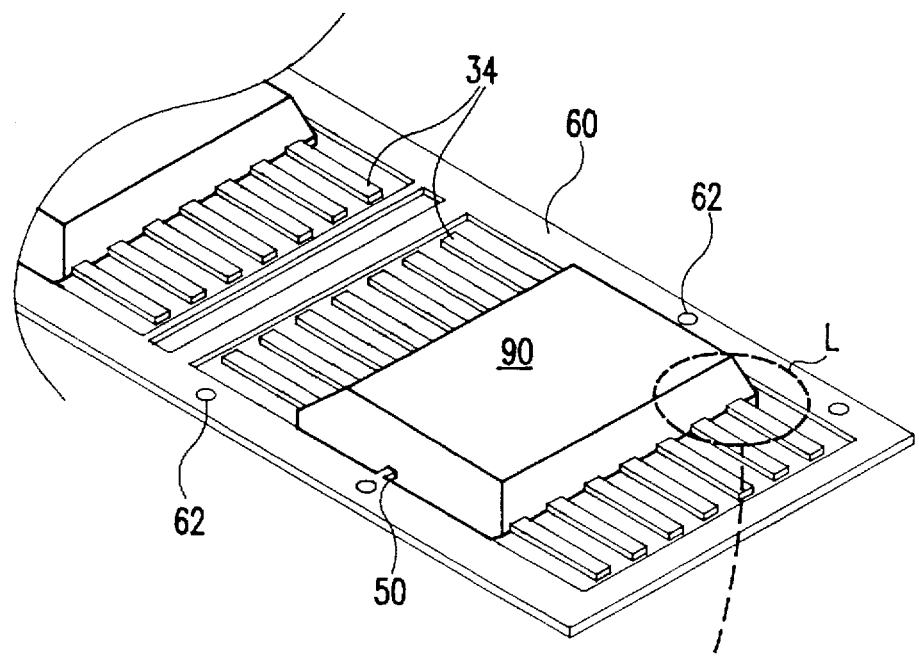
FIG. 6 shows the lead frame of FIG. 4 after deflashing process.
Figure 6A:
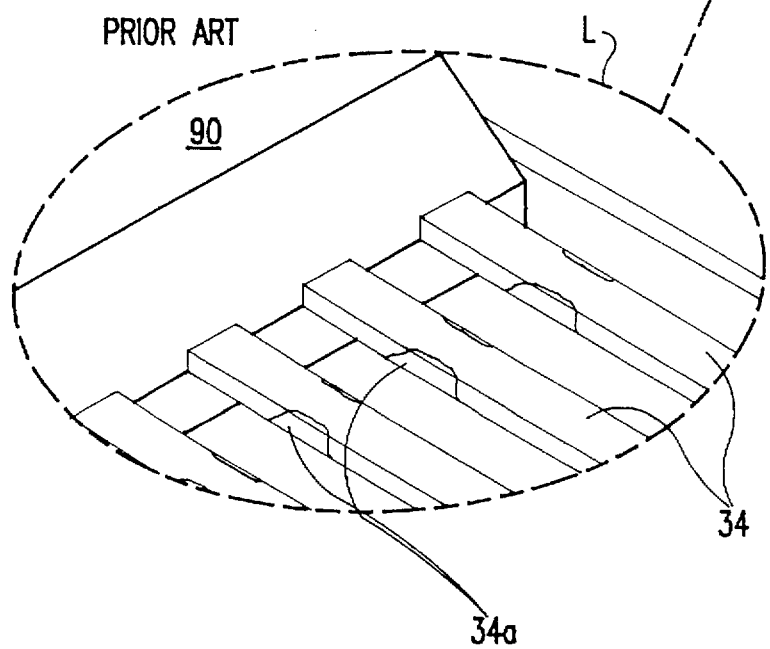
FIG. 6A shows an enlarged view of portion L of FIG. 6.
Figure 7:
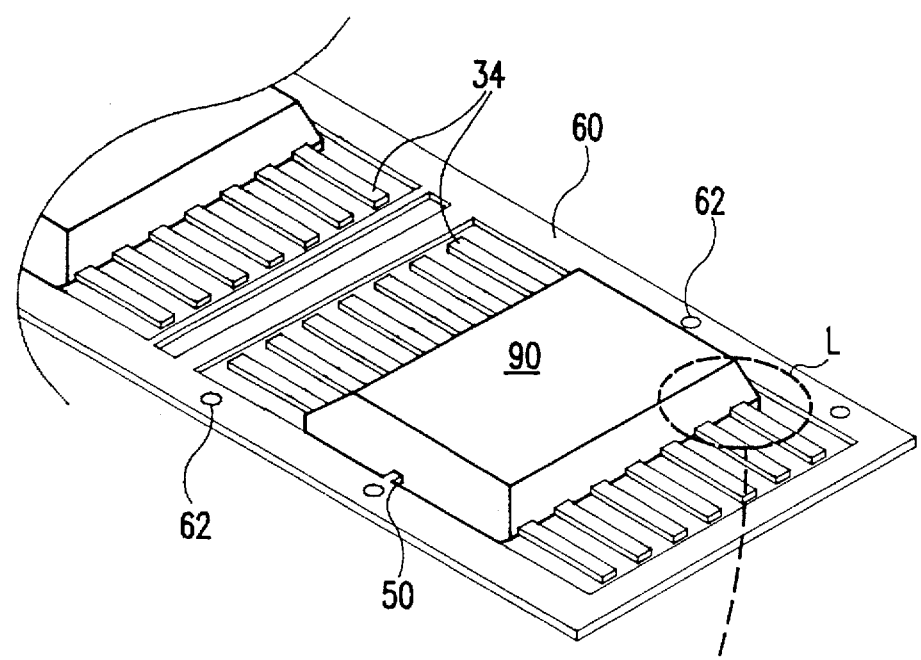
FIG. 7 shows the lead frame of FIG. 4 after replating process.
Figure 7A:
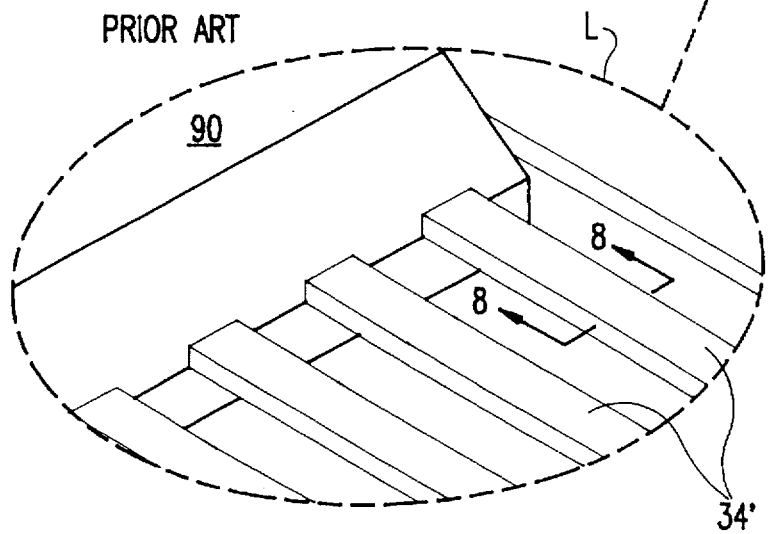
FIG. 7A shows an enlarged view of portion L of FIG. 7.
Figure 8:
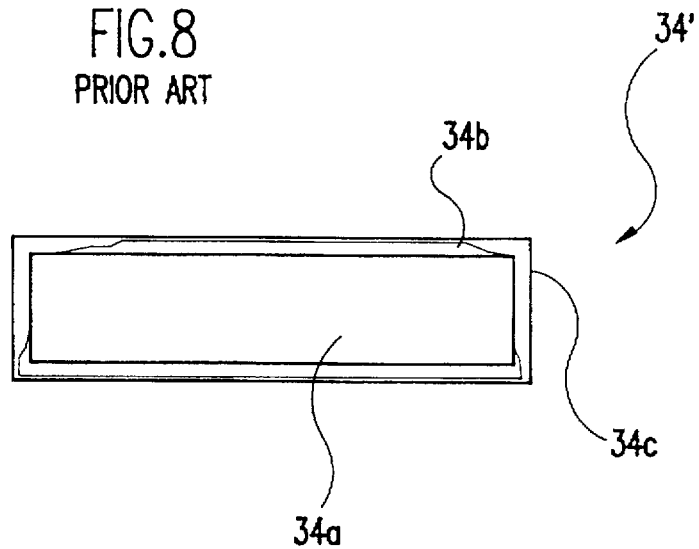
FIG. 8 is a longitudinal sectional view taken along the line 8—8 of FIG. 7.
Figure 9:
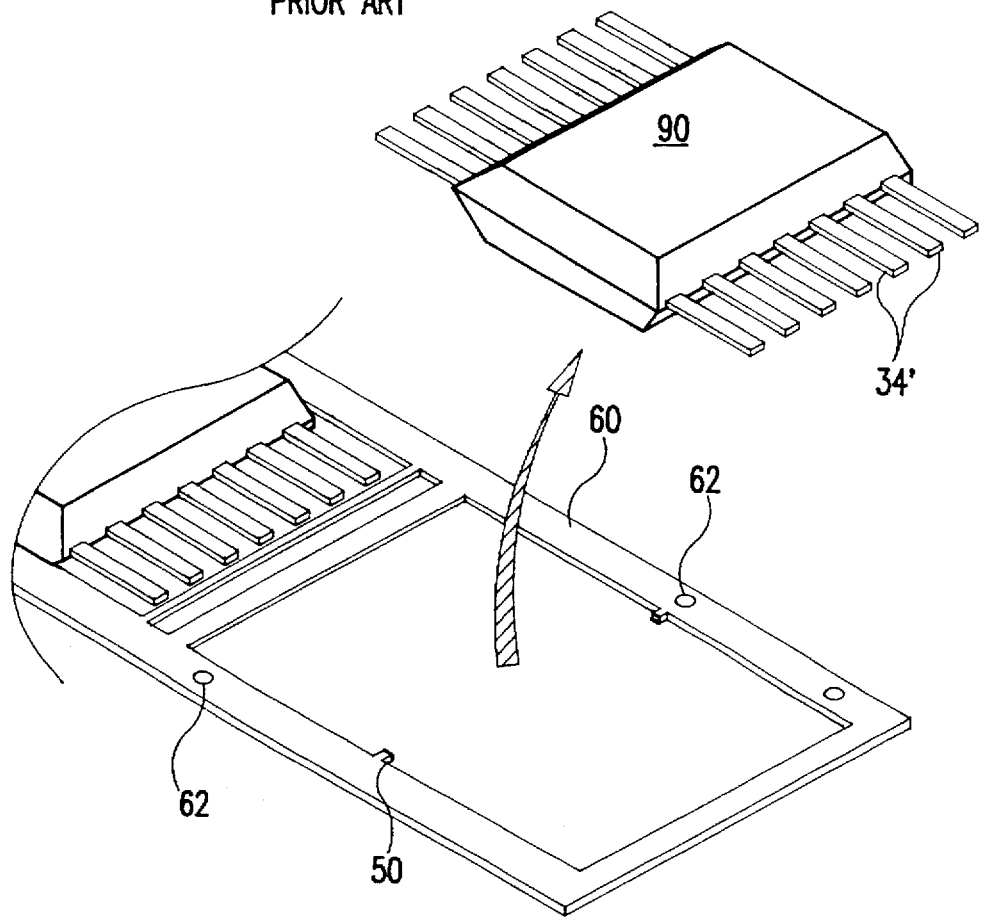
FIG. 9 shows a separation of the individual chip package from the lead frame of FIG. 7.
Figure 10:
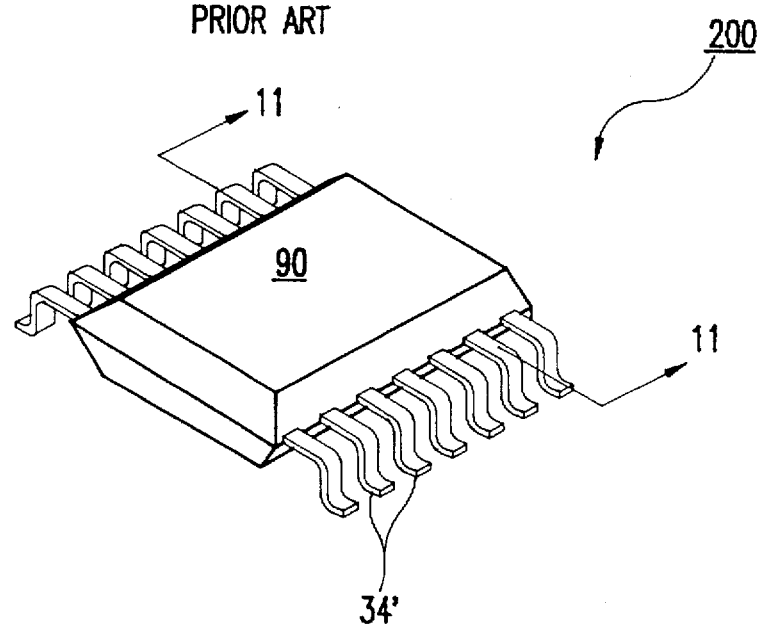
FIG. 10 shows an individual chip package with formed outer leads.
Figure 11:
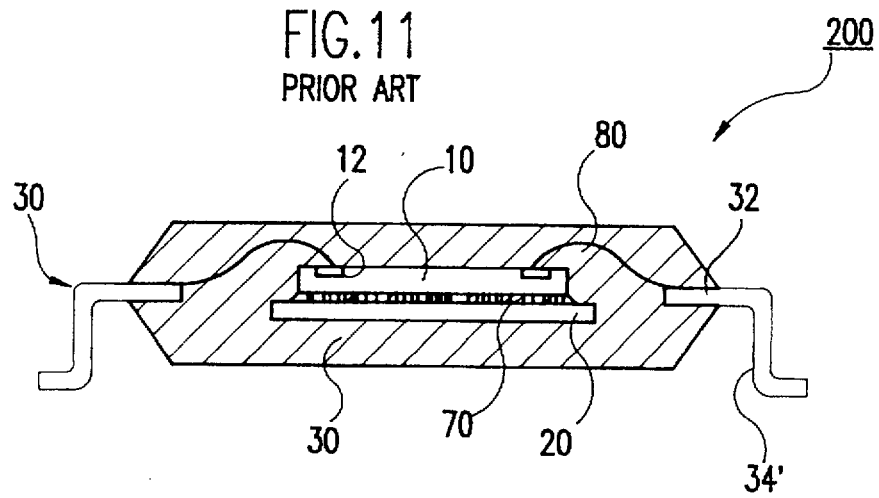
FIG. 11 is a longitudinal sectional view taken along the line 11—11 of FIG. 10.
Figure 12:
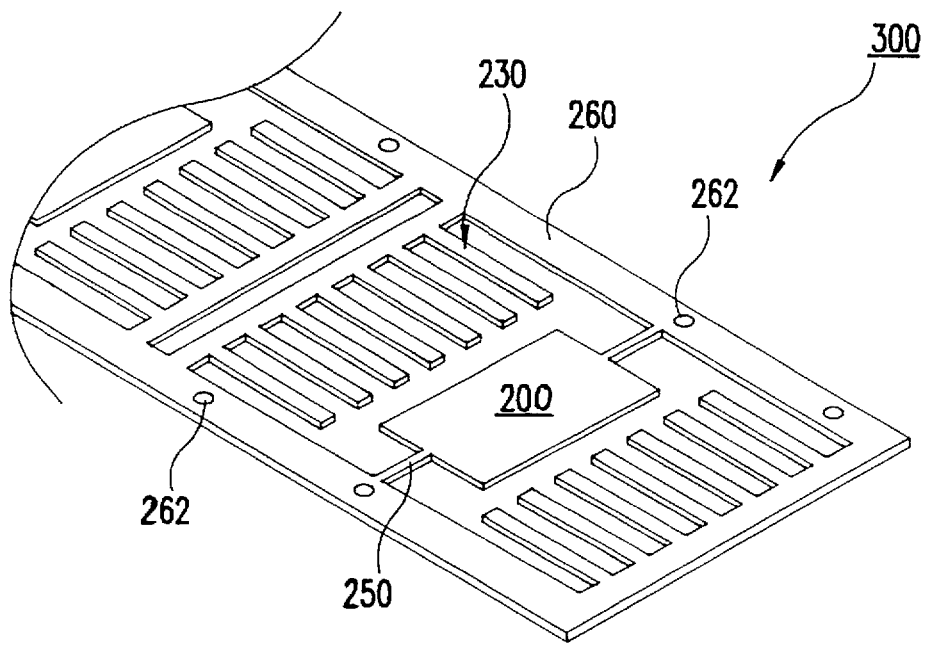
FIG. 12 is a perspective view of conventional dambarless lead frame.
Figure 13:
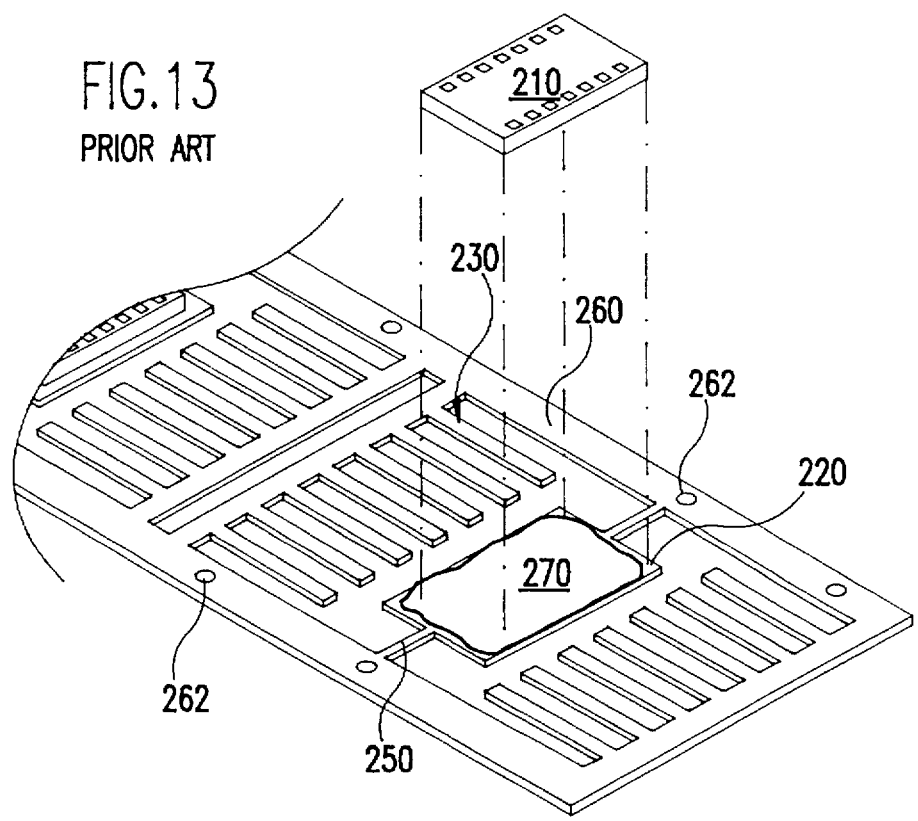
FIG. 13 shows a bonding of a chip to a lead frame.
Figure 14:
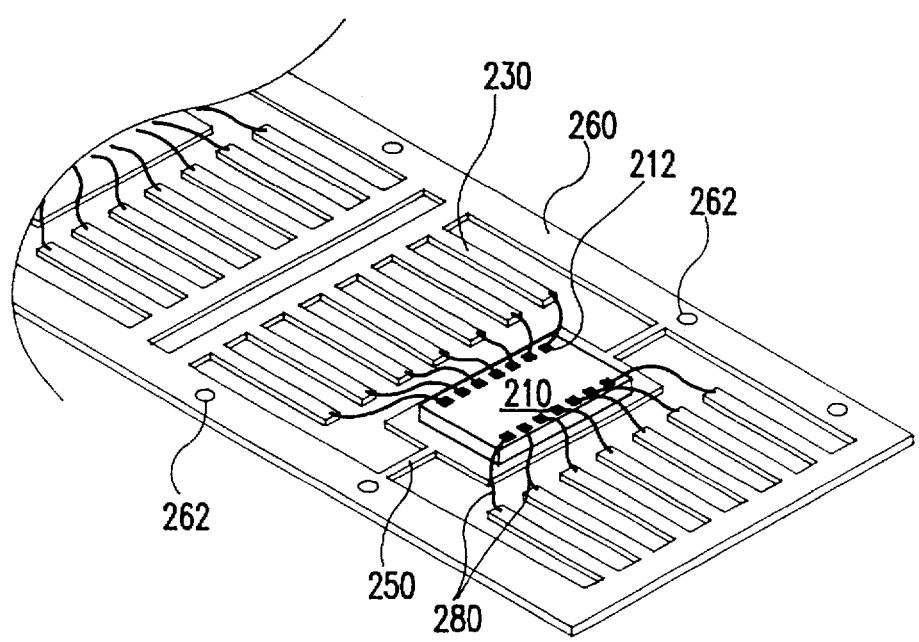
FIG. 14 shows an electrical connection of the chip to the lead frame.
Figure 15:
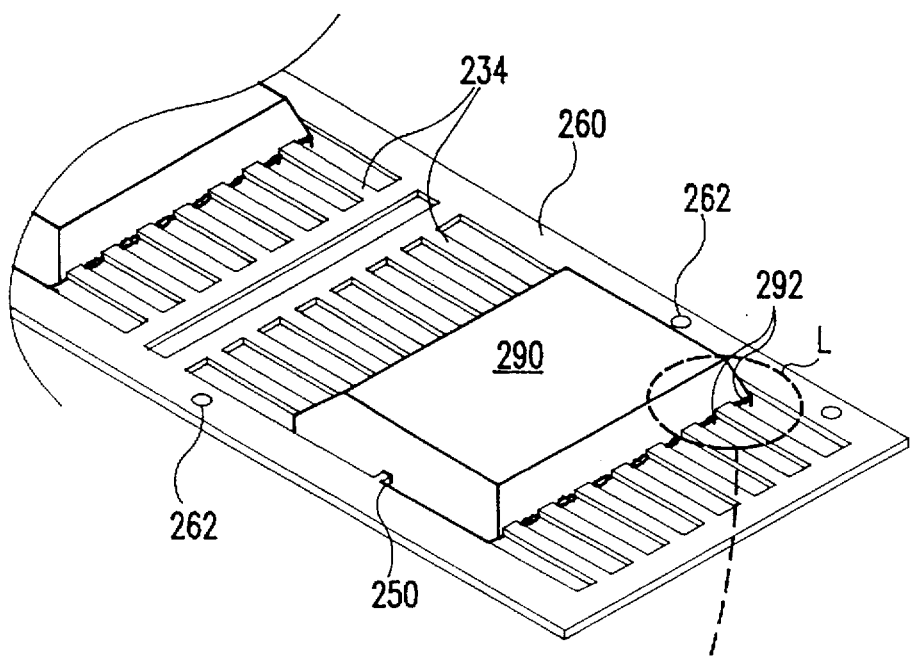
FIG. 15 shows the lead frame with molded chips.
Figure 15A:
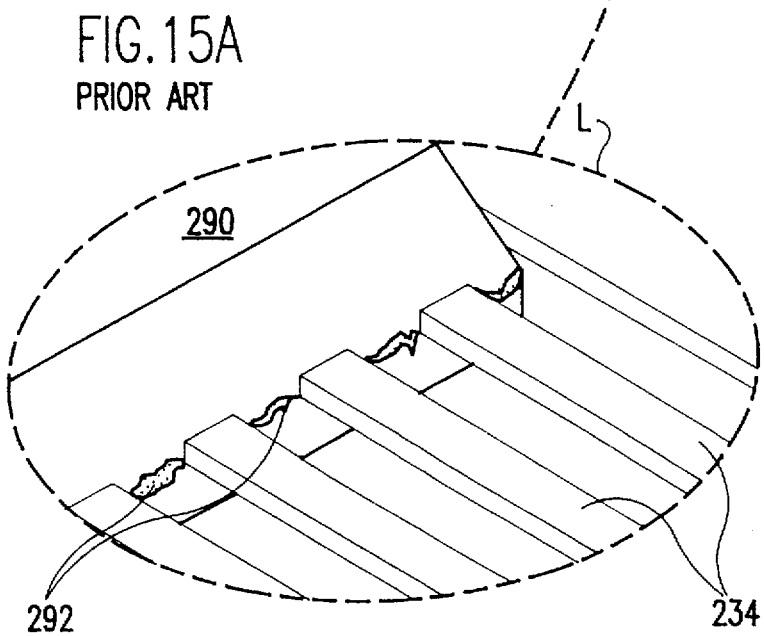
FIG. 15A shows an enlarged view of portion L of FIG. 15.
Figure 16:
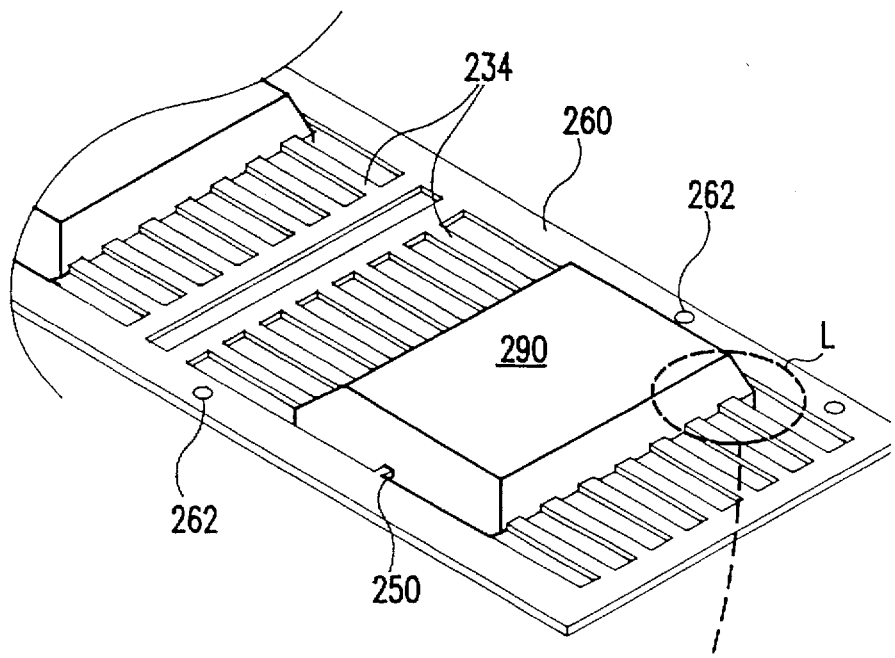
FIG. 16 shows the lead frame of FIG. 15 after deflashing process.
Figure 16A:
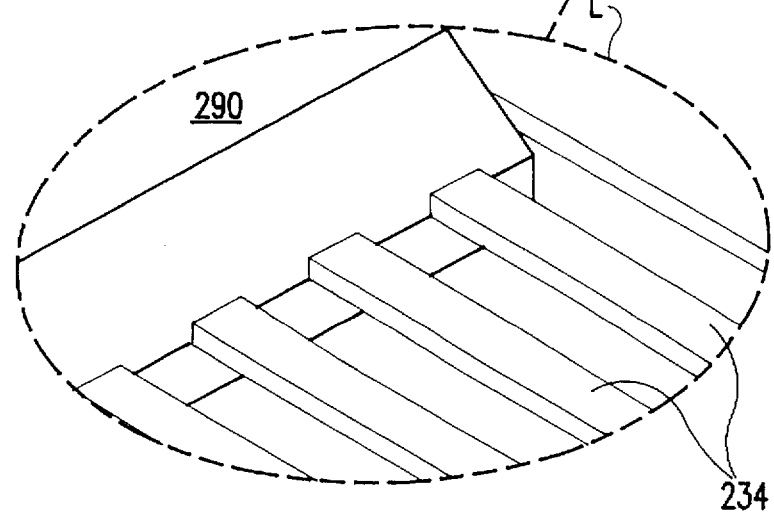
FIG. 16A shows an enlarged view of portion L of FIG. 16.
Figure 17:
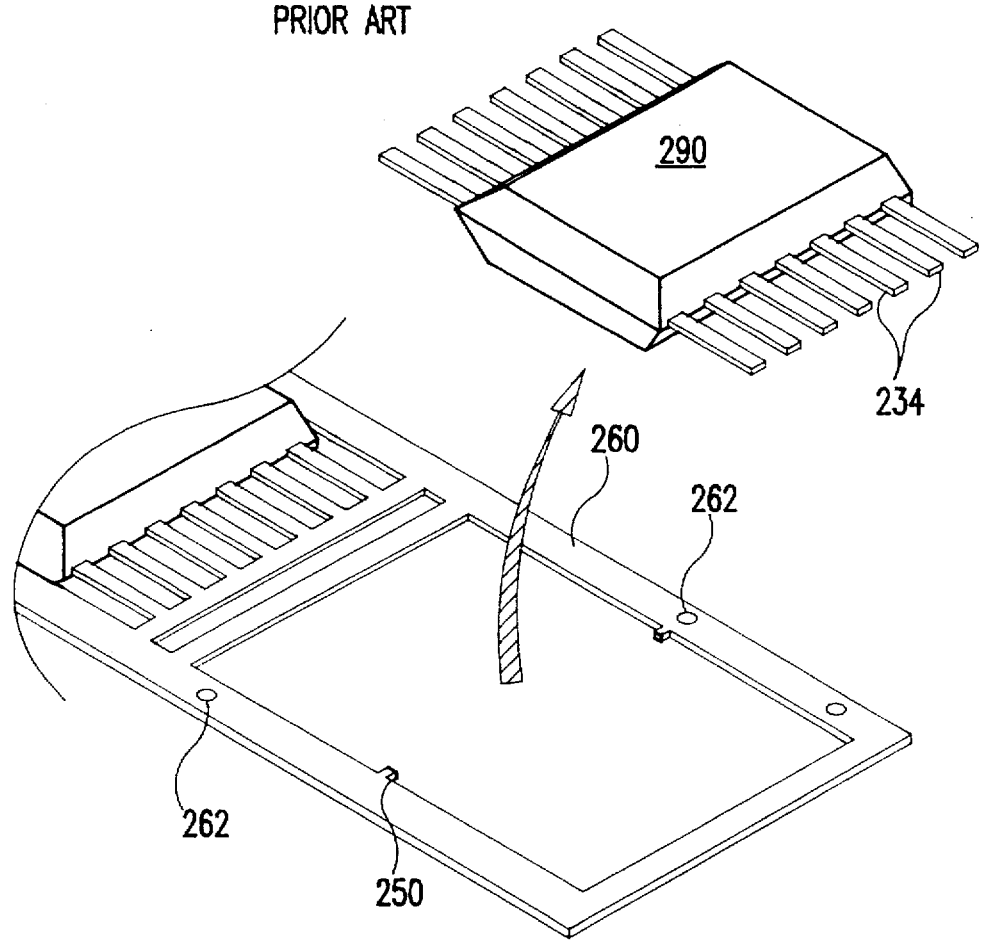
FIG. 17 shows a separation of the individual chip package from the lead frame.
Figure 18:
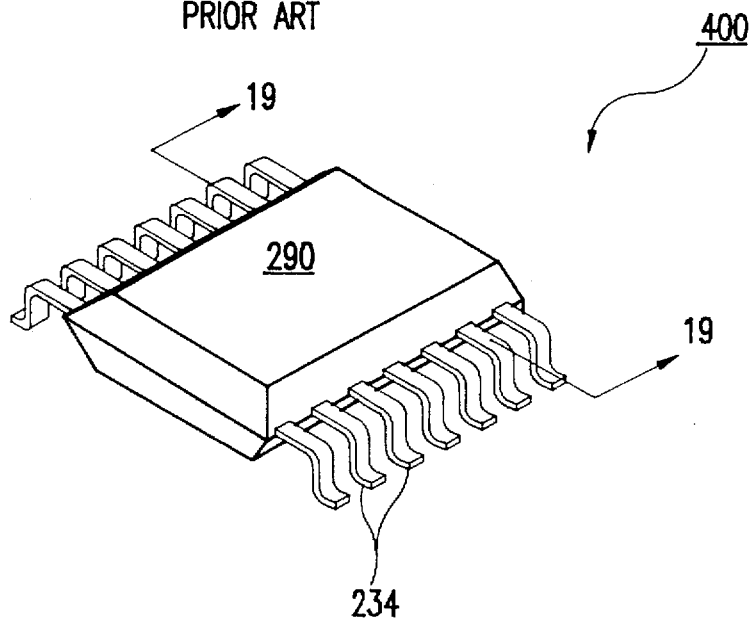
FIG. 18 shows an individual chip package with formed outer leads.
Figure 19:
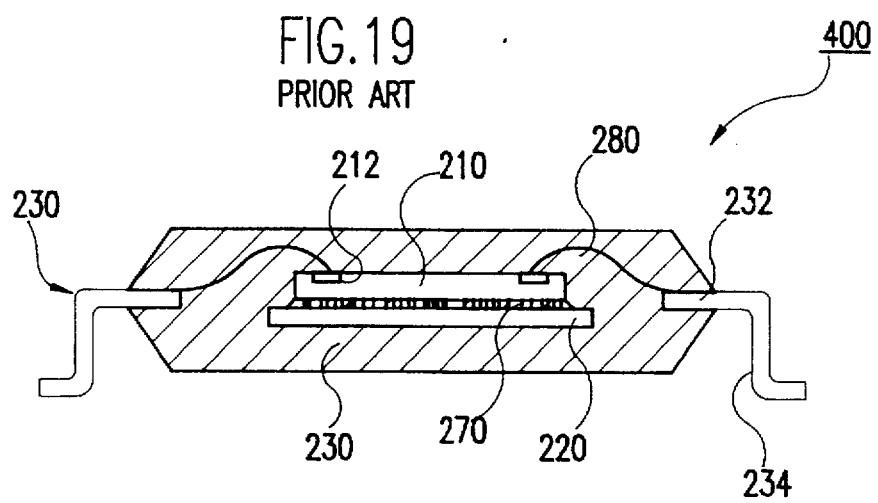
FIG. 19 is a longitudinal sectional view taken along the line 19—19 of FIG. 18.

For lead frame (500a) according to the present invention, there is not formed resin dambars between side rail (460) and its neighboring lead (430), unlike conventional lead frame (100) shown in FIG. 1, since resin dambars (440) are not removed from lead frame (500a), but remain within a final semiconductor package.

Die pad (420) is formed between opposing side rails (460) and mechanically and integrally connected to side rails (460) through tiebars (450).

A pair of rows of leads (430) is formed in parallel at both sides of die pad (420) at a distance. Leads (430) will be electrically connected to a chip mounted on die pad (420), and mechanically, commonly and integrally connected to side rails (460) through tiebars (450). For leads (430), one end faces one side of die pad, while the other end is commonly connected to tiebar (450). Leads (430) are Pd- or Ni-plated to provide a protection from the exterior environments.

Figure 25:
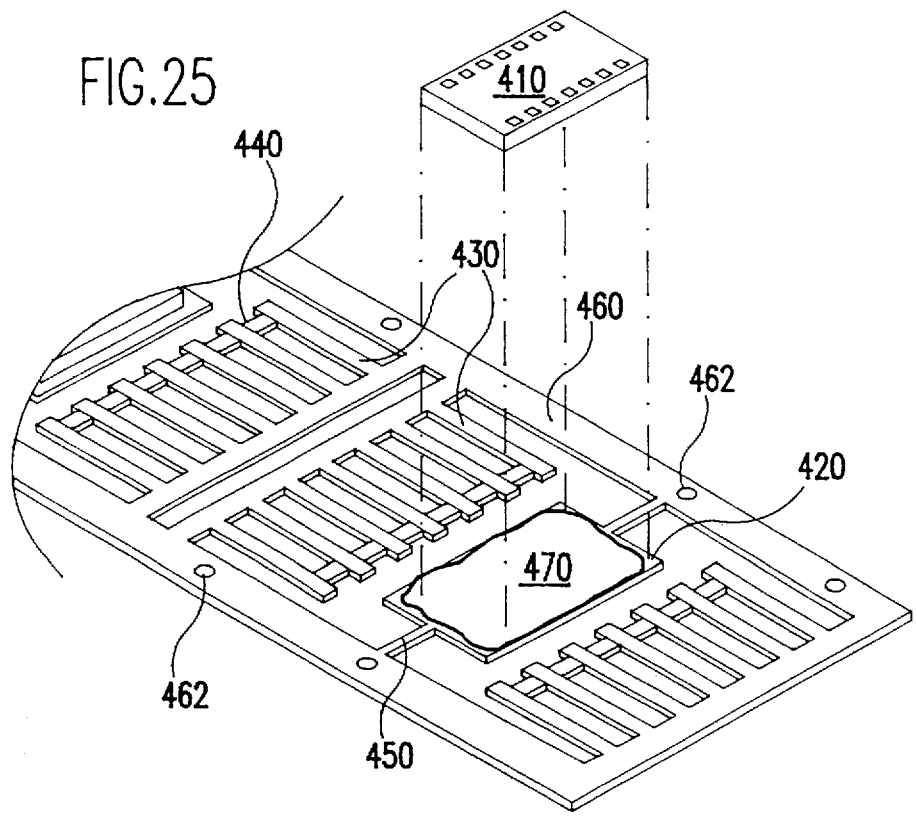
FIG. 25 shows a bonding of a chip to the lead frame of FIG. 24.
Figure 26:
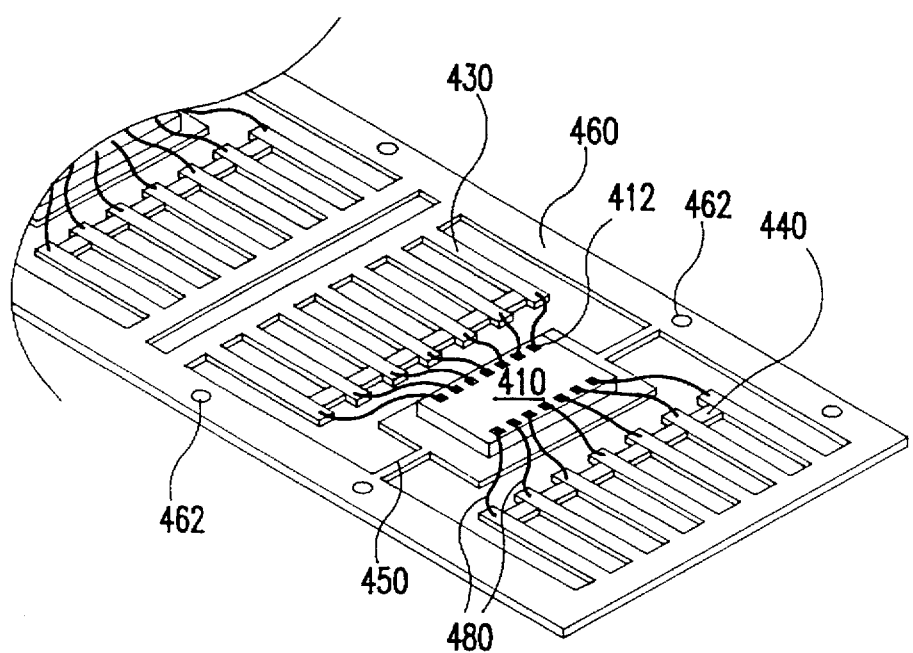
FIG. 26 shows an electrical connection of the chip to the lead frame in FIG. 25.

FIG. 26 shows an electrical connection of the chip to the lead frame. With now reference to FIG. 26, the chip (410) is attached to die pad (420) using an Ag-epoxy adhesive 470 (see FIG. 25 ). Chip (410) is electrically connected to leads (430) through bonding wires (480) which connect bonding pads (412) to respective corresponding Leads (430).

Figure 27:
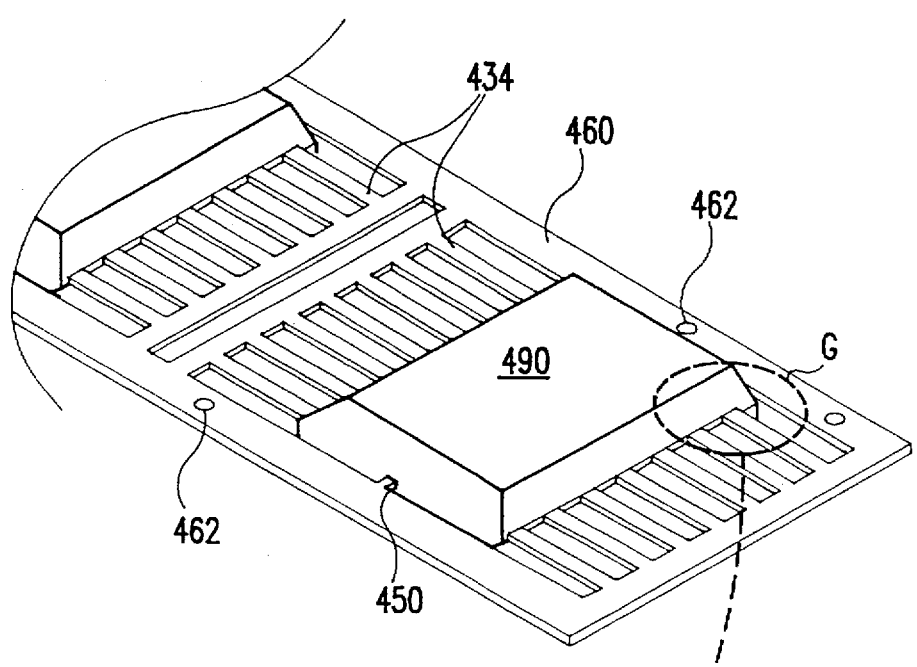
FIG. 27 shows the lead frame with molded chips.
Figure 27A:
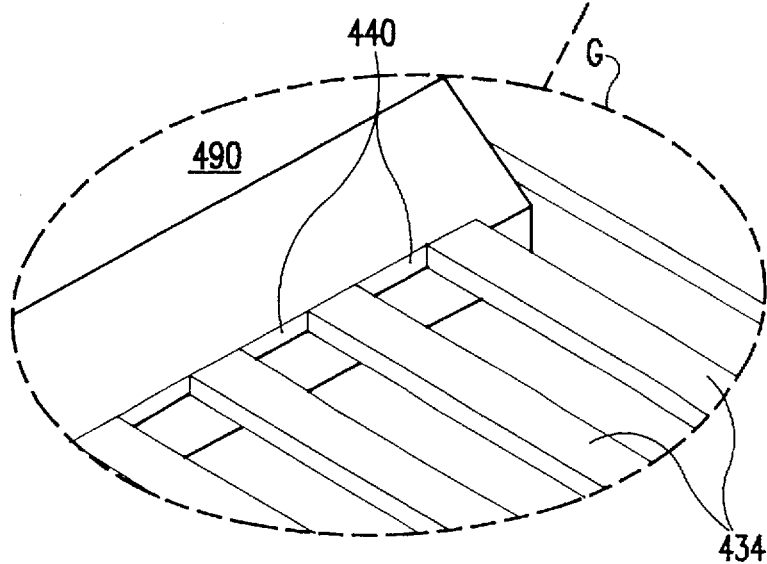
FIG. 27A shows an enlarged view of portion G of FIG. 27.
Figure 28:
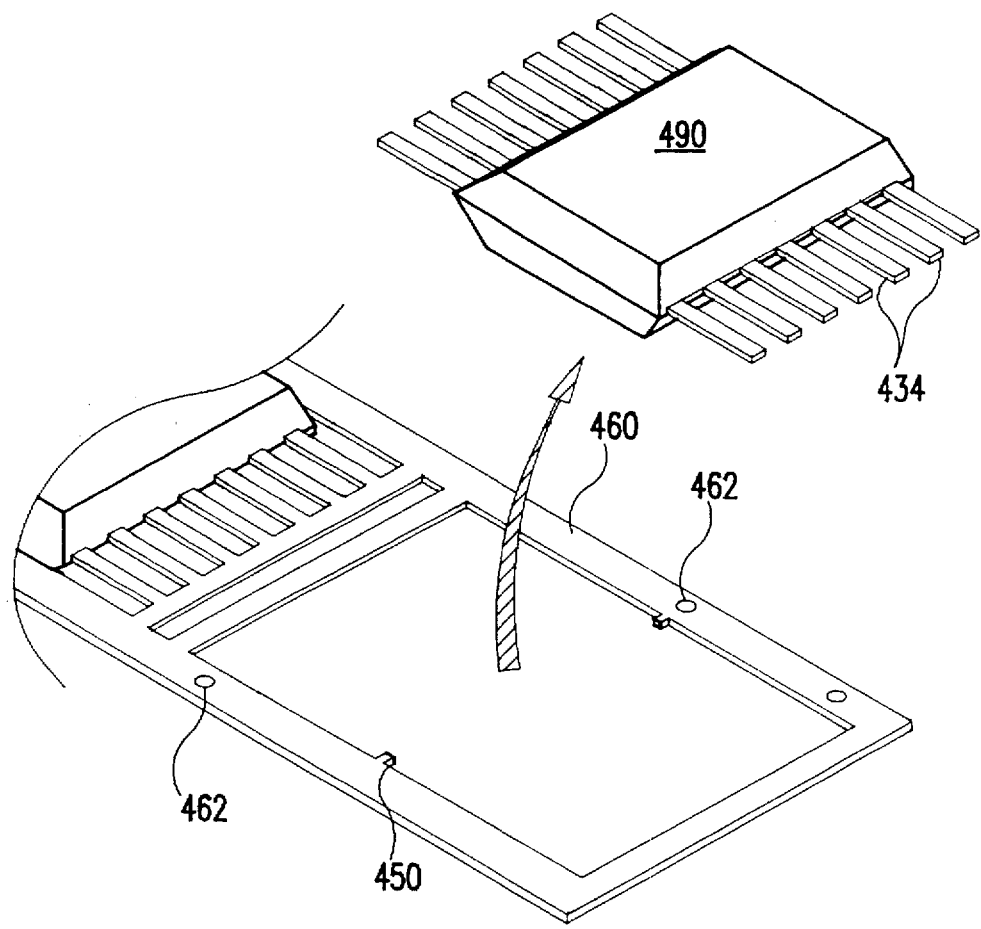
FIG. 28 shows a separation of the individual chip package from the lead frame.

FIG. 27 shows the lead frame with a molded chip; and FIG. 28 shows a separation of an individual package from the lead frame. With reference to FIGS. 27 and 28, chip (410), die pad (420), bonding wires (480), dambars (440), a part of tie bars (450) and a part of leads (430), said parts being adjacent to die pad (420), are encapsulated with a molding compound to give a package body (490). Leads (430) are consisted of inner leads (not shown) which are inside package body (490) and outer leads (434) extending from package body (490).

During the molding process, a flashing isn't formed outside package body (490) at the spaces between individual neighboring outer leads (434), since dambars are present within package body (490), one end of which is coplanarly exposed outside to package body (490). This can be accomplished by providing dambars so that their one end coincides with the point ("molding line") of leads where molding machine clamps during the molding process.

Then, tiebars (450) are removed with a cutting machine (not shown) to give an individual package (490). The individual package (490) is then subjected to a forming process in which outer leads (434) of the final semiconductor chip package (900) are bent to give an appropriate shape to be mounted onto external electronic parts such as printed circuit board. In this embodiment, the lead frames are formed to have a gull-wing shape.

Figure 29:
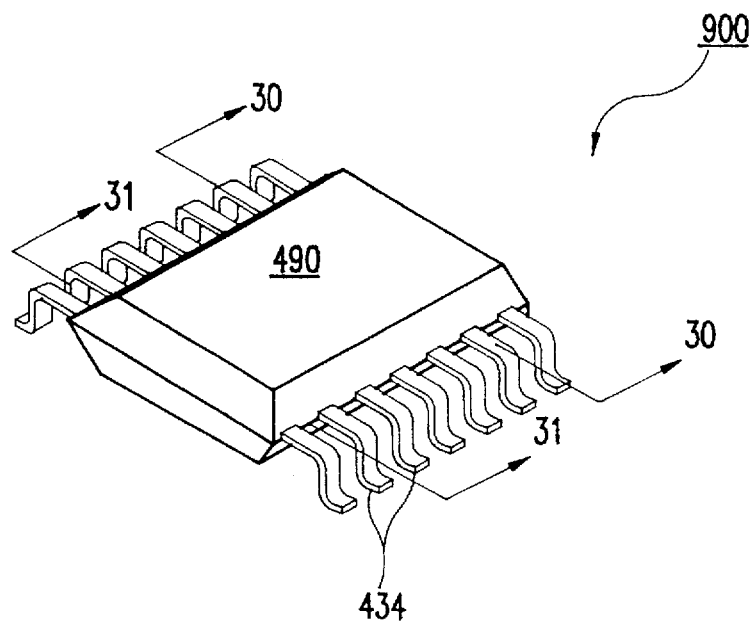
FIG. 29 shows an individual chip package with formed outer leads.
Figure 30:
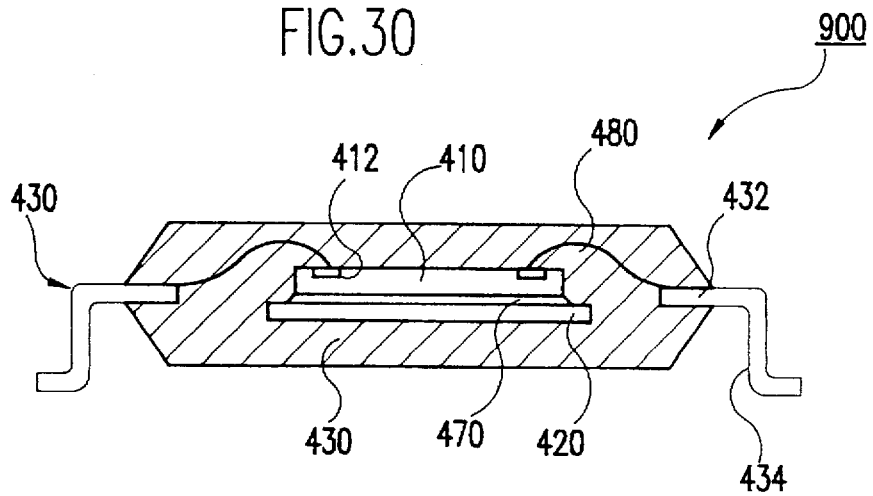
FIG. 30 is a longitudinal sectional view taken along the line 30—30 of FIG. 29.

FIGS. 30 and 31 are longitudinal sectional views taken along the line 30—30 and line 31—31 of FIG. 29, respectively. With reference to FIGS. 30 and 31, the semiconductor chip package (900) according to the present invention has a structure that a chip (410) is attached onto an upper surface of die pad (420) with an Ag-epoxy adhesive (470). The chip (410) is electrically connected to inner leads (432) through bonding wires (480) which are connected to individual bonding pads (412) and respective corresponding inner leads (432) at both ends.

The chip (410), die pad (420), bonding wires (480), dambars (440), a part of tie bars (450) and inner leads (432) are encapsulated with a molding compound to give a package body (490)(FIG. 29). Leads (430) are consisted of inner leads (432) which are embedded within the package body (490) and outer leads (434) extending from the package body (490). Furthermore, one end of dambar (440) is exposed in coplanar with a surface of the package body (490).

The above-described method according to the present invention has the following advantages:

(1) A flashing-removing process ("Deflashing process") is not required. Since dambars are present within the package body, and one end thereof is coplanarly exposed outside the package body, a flashing is not formed during molding process. By contrary, for the conventional packages as shown in FIGS. 1 through 11, the molding line is between die pad and dambars so that a flashing may be formed at the outer surface of the package body at the spaces between leads. For the other conventional package as shown in FIGS. 12 through 19, since dambars are not formed, a relatively large amount of flashing is formed at the outer surface of the package body at the spaces between leads.

(2) Replating of the outer leads isn't required. Since dambars are within the package body, it is not required to remove dambars.

Until now, although a specific embodiment of the present invention which employs a stencil to prepare resin dambars between leads has been described, it should be understood that any means or methods can be used as long as liquid resin compounds can be injected to the points where dambars will be formed.

According to the present invention, dambars are formed at the points which will be embedded within the package body and are coinciding with a molding line of a molding machine, thereby deflashing, dambar-removing and replating processes can be omitted. Therefore, a simplification of the process, saving of production cost, and prevention of environmental pollution by deflashing and/or replating processes can be attained.

Furthermore, the formation of dambars using liquid resin compounds with a stencil allows reductions of production time and cost.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for manufacturing semiconductor chip package comprising steps of:
   (a) preparing a lead frame which comprises a pair of opposing side rails which have a plurality of through holes on their upper surface; a die pad onto which a chip will be mounted; a pair of rows of leads, each row being disposed at both sides of the die pad at a distance; and tiebars for mechanically and integrally connecting said die pad to said side rails;
   (b) filling a resin compound between the leads only and curing the resin compound to make dambars;
   (c) attaching said chip to an upper surface of said die pad, and electrically connecting said chip to the leads;
   (d) encapsulating said chip, said die pad, said dambars, a part of said leads and a part of said tiebars to give a package body which is still attached to said lead frame;
   (e) cutting said tiebars from lead frame to separate an individual package; and
   (f) forming leads extending from the package to have an appropriate bend shape.

2. The method of claim 1, wherein said step (b) comprises following steps of:
   (b-1) preparing a fixing frame comprising a plurality of receiving parts for receiving said leads, partition wall, for separating the receiving parts from each other, and walls formed at four sides of fixing frame; and a stencil comprising walls provided with a plurality of guide holes corresponding to respective guide pins formed at said walls of said fixing frame, and a printing part having a plurality of perforations at points where resin dambars will be formed between leads of said lead frames placed in said receiving parts;
   (b-2) placing said lead frames in said receiving parts by fitting said through holes of the lead frame to said projections of the receiving parts;
   (b-3) placing said stencil onto said lead frames, and fixing the stencil to said fixing frame by fitting said guide holes of the stencil to said guide pins of the fixing frame;
   (b-4) filling a liquid resin compound on said printing parts of the stencil and pressing the stencil with a pressing means so that said resin compound can penetrate through said perforations of the printing part into between leads of said lead frames;
   (b-5) removing said stencil and said pressing means;
   (b-6) curing said resin compound to form dambars; and
   (b-7) removing said fixing frame from said lead frame.

3. The method of claim 2, wherein an upper surface of said receiving parts is in contact with a lower surface of said lead frames.

4. The method of claim 2, wherein an upper surface of said lead frames placed in respective corresponding receiving parts are in contact with a lower surface of said stencil.

5. The method of claim 2, wherein said liquid resin compound is filled into a bottom of said receiving parts, into spaces between lead frames, and into a lower surface of said printing part.

6. The method of claim 3, wherein said liquid resin compound is filled into a bottom of said receiving parts, into spaces between lead frames, and into a lower surface of said printing part.

7. The method of claim 4, wherein said liquid resin compound is filled into a bottom of said receiving parts, into spaces between lead frames, and into a lower surface of said printing part.

8. The method of claim 2, wherein said dambars are embedded within said package body with their one end being coplanarly exposed outside the package body.

9. The method of claim 1, wherein said dambars are formed so as to have same thickness as that of said leads of lead frames.

10. The method of claim 2, wherein said dambars are formed so as to have same thickness as that of said leads of lead frames.

11. A method for manufacturing semiconductor chip package comprising steps of:
   (a) preparing a lead frame which comprises a pair of opposing side rails which have a plurality of through holes on their upper surface, a die pad onto which a chip will be mounted, a pair of rows of leads, each row being spaced from each side of said die pad, and tie bars for mechanically and integrally connecting said die pad to said side rails;
   (b) filling a resin compound between the leads only and curing the resin compound to make dambars, wherein said dambars have same thicknesses as that of said leads;
   (c) attaching said chip to an upper surface of said die pad, and electrically connecting said chip to the leads;
   (d) encapsulating said chip, said die pad, said dambars, a part of said leads and a part of said tiebars to produce a package body which is still attached to said lead frame;
   (e) cutting said tiebars from the lead frame to separate an individual package;
   (f) forming leads extending from the package to have an appropriately bended shape.

* * * * *